(12) United States Patent
Fukumoto

(10) Patent No.: US 9,219,134 B2
(45) Date of Patent: Dec. 22, 2015

(54) SEMICONDUCTOR DEVICE AND METHOD OF MANUFACTURING THE SAME

(71) Applicant: Renesas Electronics Corporation, Kanagawa (JP)

(72) Inventor: Hideto Fukumoto, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 50 days.

(21) Appl. No.: 14/067,267

(22) Filed: Oct. 30, 2013

(65) Prior Publication Data

US 2014/0126299 A1    May 8, 2014

(30) Foreign Application Priority Data

Nov. 7, 2012  (JP) ................. 2012-245826

(51) Int. Cl.
| | |
|---|---|
| *G11C 11/34* | (2006.01) |
| *H01L 29/66* | (2006.01) |
| *G11C 16/04* | (2006.01) |
| *H01L 29/423* | (2006.01) |
| *H01L 29/788* | (2006.01) |
| *H01L 27/115* | (2006.01) |

(52) U.S. Cl.
CPC ...... *H01L 29/66825* (2013.01); *G11C 16/0416* (2013.01); *H01L 29/42328* (2013.01); *H01L 29/7881* (2013.01); *G11C 2213/71* (2013.01); *H01L 27/11521* (2013.01)

(58) Field of Classification Search
USPC ................ 365/185.01, 185.05, 185.1, 185.26
See application file for complete search history.

(56) References Cited

U.S. PATENT DOCUMENTS

| | | | |
|---|---|---|---|
| 7,265,411 B2 | 9/2007 | Kang | |
| 2009/0039410 A1 | 2/2009 | Liu et al. | |
| 2012/0184076 A1* | 7/2012 | Hsu et al. | ........................ 438/264 |
| 2012/0201084 A1* | 8/2012 | Lin et al. | .................. 365/185.26 |

FOREIGN PATENT DOCUMENTS

| | | |
|---|---|---|
| JP | 7-221206 A | 8/1995 |
| JP | 2006-108668 A | 4/2006 |
| JP | 2009-44164 A | 2/2009 |

* cited by examiner

*Primary Examiner* — Fernando Hidalgo
(74) *Attorney, Agent, or Firm* — Sughrue Mion, PLLC

(57) ABSTRACT

A semiconductor device has a semiconductor layer, a floating gate electrode provided over the semiconductor layer via a first insulation film, and an erase gate electrode to which an erase voltage is applied. The floating gate electrode has an opposing region that opposes via a second insulation film to the erase gate electrode. The opposing region has such a shape that multiple electric field concentrating portions are formed when the erase voltage is applied to the erase gate electrode.

15 Claims, 11 Drawing Sheets

FIRST DIRECTION

SEMICONDUCTOR DEVICE AND METHOD OF MANUFACTURING THE SAME

CROSS-REFERENCE TO RELATED APPLICATIONS

The disclosure of Japanese Patent Application No. 2012-245826 filed on Nov. 7, 2012 including the specification, drawings, and abstract is incorporated herein by reference in its entirety.

BACKGROUND

The present invention relates to a semiconductor device and a method of manufacturing the semiconductor device.

Non-volatile semiconductor memory devices have been known as a sort of semiconductor devices. As the non-volatile semiconductor memory device, flash memories have been known.

Japanese Unexamined Patent Publication No. 2009-44164 discloses a split gate non-volatile memory cell. The cell has a select gate above a portion of a channel region, a floating gate above other portion of the channel region, a control gate over the floating gate, and an erase gate adjacent the floating gate. The erase gate has an overhang extending over the floating gate.

Further, Japanese Unexamined Patent Publication No. Hei 7 (1995)-221206 discloses that one of upper edge portions of a floating gate that covers a control gate is fabricated acutely by isotropic etching.

Further, Japanese Unexamined Patent Publication No. 2006-108668 discloses a semiconductor device. The semiconductor device has an insulated floating gate provided over a semiconductor substrate, an insulated program gate formed over at least a lateral side of the floating gate, and an insulated erase gate provided adjacent the floating gate.

SUMMARY

In the non-volatile memory device, charges are injected to a floating gate electrode upon writing. On the other hand, an erase voltage is applied on an erase gate electrode upon erasure. By the application of the erase voltage, charges in the floating gate electrode are drawn out to the erase gate electrode.

Upon erasure, a high voltage is necessary as the erase voltage. For applying the high voltage, an area of peripheral circuit of the semiconductor device is increased to increase the cost. For example, in the development of flash hybridized micro computers for low end, great importance is attached to the reduction of the cost and high integration degree.

Other subjects and novel features will become apparent in view of the description of the present specification and the accompanying drawings.

A semiconductor device according to a preferred embodiment of the present invention comprises a semiconductor layer, a floating gate electrode provided over the semiconductor layer via a first insulation film and an erase gate electrode applied with an erase voltage. The floating gate electrode includes an opposing region that opposes the erase gate electrode via a second insulation film. The opposing region has such a shape that multiple electrode concentration portions are formed when the erase voltage is applied to the erase gate electrode.

A method of manufacturing a semiconductor device according to other preferred embodiment of the invention is a method of manufacturing a semiconductor device having a semiconductor layer, a floating gate electrode provided over the semiconductor layer via a first insulation film, and an erase gate electrode applied with an erase voltage. The floating gate electrode includes an opposing region that opposes via a second insulation film to the erase gate electrode and the opposing region has such a shape that multiple electrode concentration portions are formed when the erase voltage is applied to the erase gate electrode. The method of manufacturing the semiconductor device includes a step of forming the floating gate via the first insulation film over the semiconductor layer and a step of forming the erase gate electrode.

The first embodiment provides a semiconductor device and a method of manufacturing the semiconductor device capable of decreasing the erase voltage.

DETAILED DESCRIPTION

Embodiments of the present invention are to be described with reference to the drawings.

First Embodiment

Figure 1:
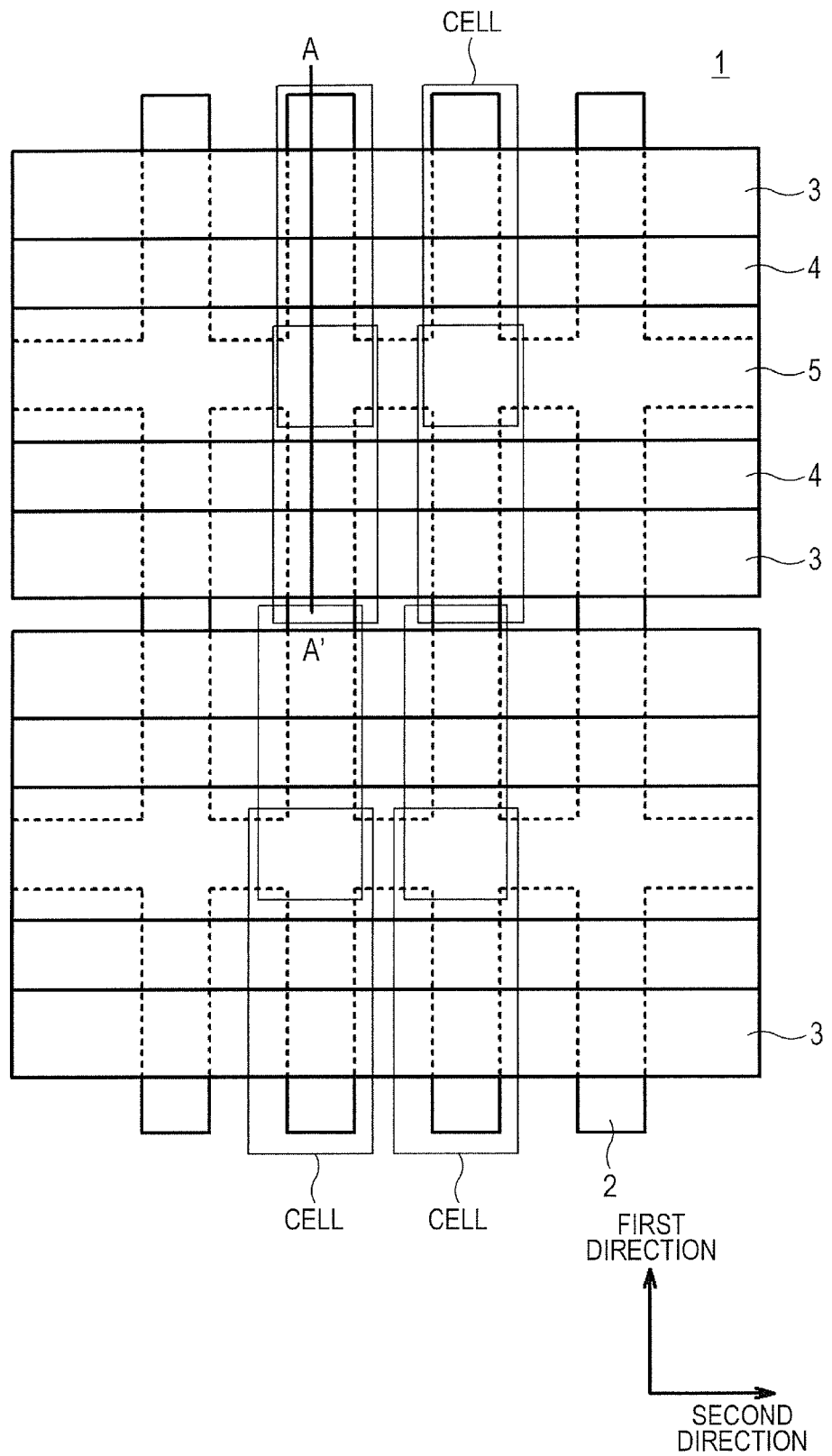
FIG. 1 is a plan view illustrating a semiconductor device according to a first embodiment.

FIG. 1 is a plan view illustrating a semiconductor device 1 according to this embodiment. In FIG. 1, a first direction and a second direction perpendicular to each other are defined. As illustrated in FIG. 1, the semiconductor device 1 has multiple cells.

Figure 2:
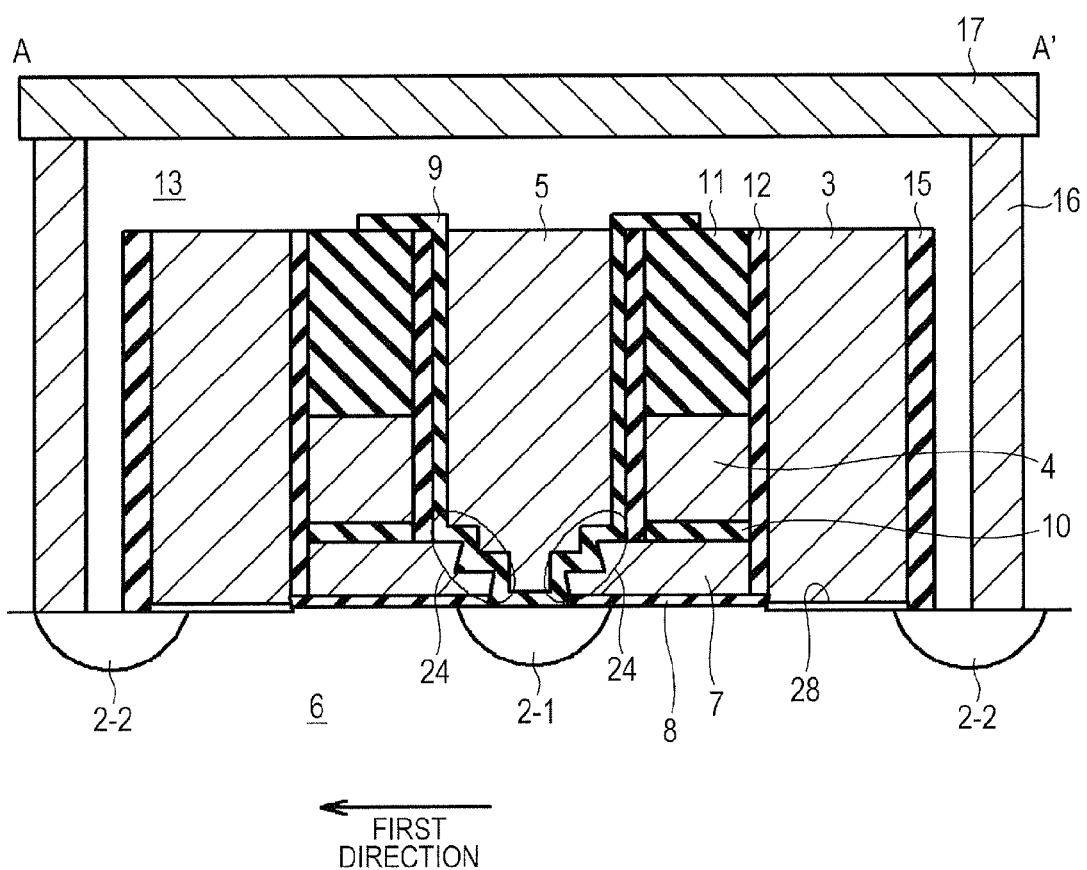
FIG. 2 is a cross sectional view showing an A-A' cross section in FIG. 1.

FIG. 2 is a cross sectional view illustrating an A-A' cross section in FIG. 1, which illustrates two cells adjacent in the first direction.

As illustrated in FIG. 2, the semiconductor device 1 has a semiconductor substrate 6 (semiconductor layer), a source region (2-1), a drain region (2-2), a floating gate electrode 7, a control gate electrode 4, a select gate electrode 3, and an erase gate electrode 5. As illustrated in FIG. 1, the control gate electrode 4, the select gate electrode 3, and the erase gate electrode 5 extend respectively in the second direction.

The semiconductor substrate 6 is formed, for example, of a P-type single crystal silicon substrate.

The source region 2-1 and the drain region 2-2 (diffusion layer 2) are formed to the main surface of the semiconductor substrate 6. The source region 2-1 and the drain region 2-2 each have a conduction type which is opposite to that of the semiconductor substrate 6 and for example, n-type impurity regions. The source region 201 and the drain region 2-2 are spaced apart. In the semiconductor substrate 6, a region between the source region 2-1 and the drain region 2-2 defines a channel forming region.

The floating gate electrode 7 is provided via the first insulation film 8 over the main surface of the semiconductor substrate 6. The floating gate electrode 7 is provided so as to be situated between the source region 2-1 and the drain region 2-2 as viewed from above. Further, the floating gate electrode 7 and the drain region 2-2 are spaced apart as viewed from above.

The control gate electrode 4 is provided via a third insulation film 10 over the floating gate electrode 7. An insulation layer 11 is provided over the control gate electrode 4. Lateral sides of the third insulation film 10, the control gate electrode 4, and the insulation layer 11 are covered by a fourth insulation film 12.

The erase gate electrode 5 is positioned so as to cover the end of the floating gate electrode 7 via the second insulation film 9 (tunnel insulation film). Specifically, the erase gate electrode 5 covers one end of the floating gate electrode 7 in the first direction. Thus, a portion of the floating gate electrode 7 (end region) opposes a portion of the erase gate electrode 5. In the floating gate electrode 7, a region that opposes the erase gate electrode 5 is referred to as an opposing region 24. Further, the erase gate electrode 5 also covers the source region 2-1 via the second insulation film 9.

The select gate electrode 3 is provided via a select gate insulation film 28 over the semiconductor substrate 6. The select gate electrode 3 is positioned so as to be situated between the floating gate electrode 7 and the drain region 2-2 as viewed from above. The select gate electrode 3 and the floating gate electrode 7 are insulated from each other by the fourth insulation film 12. Further, also the select gate electrode 3 and the control gate electrode 4 are also insulated from each other by the fourth insulation film 12. A fifth insulation film 15 is formed over the lateral side of the select gate electrode 3 on the side of the drain region 2-2.

The erase gate electrode 5, the insulation layer 11, and the select gate electrode 3 are covered by an interlayer insulation film 13. A first interconnect layer 17 is provided over the interlayer insulation film 13. A contact 16 is buried in the interlayer insulation film 13. The drain region 2-2 is connected to an interconnect provided in the first interconnect layer 17 via the contact 16.

In the semiconductor device described above, voltage is applied upon data writing to a cell as a target of writing. Specifically, voltages are applied to the control gate electrode 4, the select gate electrode 3, etc. such that a write current flows between the source region 2-1 and the drain region 2-2. Thus, charges are injected from the semiconductor substrate 6 to the floating gate electrode 7. Read voltages are applied upon data reading to the control gate electrode 4 and the select gate electrode 3. Further, a voltage is applied also between the source region 2-1 and the drain region 2-2. It is determined whether or not a current flows between the source region 2-1 and the drain region 2-2 depending on whether the charges are injected or not to the floating gate electrode 7. Accordingly, data are read out by detecting the presence or absence of a current between the source region 2-1 and the drain region 2-2.

On the other hand, an erase voltage is applied to the erase gate electrode 5 upon erasure. By the application of the erase voltage, the charges injected into the floating gate electrode 7 are drawn out to the erase gate electrode 5.

In this embodiment, the floating gate electrode 7 has such a shape that multiple electric field concentration portions are formed when the erase voltage is applied. Specifically, as illustrated in FIG. 2, the floating gate electrode 7 has multiple corners in the opposing region 24. More specifically, the cross section of the floating gate electrode 7 forms a stepwise shape in the opposing region 24. On the other hand, also the erase gate electrode 5 has a shape conforming to the opposing region 24. That is, multiple concave portions conforming to the multiple corners are provided to a portion of the erase gate electrode 5 that opposes the floating gate electrode 7.

Upon erasure, the charges in the floating gate electrode 7 are drawn out via the electric field concentration portions to the erase gate electrode 5. In this embodiment, an electric field concentration portion is formed at each of the multiple corners upon erasure. Accordingly, the charges move from the floating gate electrode 7 via the multiple portions (plurality of corners) to the erase gate electrode. Since the charges are drawn out at the multiple portions, an erase efficiency can be improved to shorten the erase time compared with the case where the charges are drawn out only at one portion. Further, the erase voltage can be suppressed. Further, this can decrease the area of a peripheral circuit to decrease the cost.

When the erase operation is repeated, the charges pass the second insulation film 9 repeatingly. As a result, the second insulation film 9 is deteriorated. Therefore, the life of the semiconductor device 1 is determined depending on the deterioration of the second insulation film 9. In this embodiment, the charges are drawn out via the multiple portions upon erasure. Accordingly, compared with a case where the charges are drawn out only at one portion, the amount of the charges passing at each of the portions (each of the corners) is decreased in this embodiment. Thus, deterioration of the second insulation film 9 can be suppressed to improve the durability of the semiconductor device 1.

Each of the multiple corners preferably has such a shape that a deeper portion has a smaller width of the floating gate electrode 7 in the first direction. That is, the angle of the corner (angle formed between the upper surface and the lateral side) is preferably smaller than 90°. That is, each of the corners preferably has a pointed shape. That is, the floating gate electrode 7 preferably has an inversely tapered shape in the opposing region 24. When such a shape is adopted, an electric field strength can be increased at each of the corners to further improve the erase efficiency.

Further, in this embodiment, a portion of the erase gate electrode 5 that corresponds to the corner portion of the opposing region 24 forms a concave portion. When multiple corners are merely provided to the end of the floating gate electrode 7, a coupling capacity between the floating gate electrode 7 and the erase gate electrode 5 is sometimes increased. When the coupling capacity increases, the erase efficiency lowers. On the contrary, according to this embodiment, since the erase gate electrode 5 has a shape conforming to the opposing region 24 (shape conforming to the floating gate electrode 7), increase of the coupling capacity can be prevented.

Successively, a method of manufacturing the semiconductor device 1 according to this embodiment is to be described.

FIG. 3 to FIG. 17 are cross sectional views illustrating a method of manufacturing the semiconductor device 1 according to this embodiment.

Figure 3:
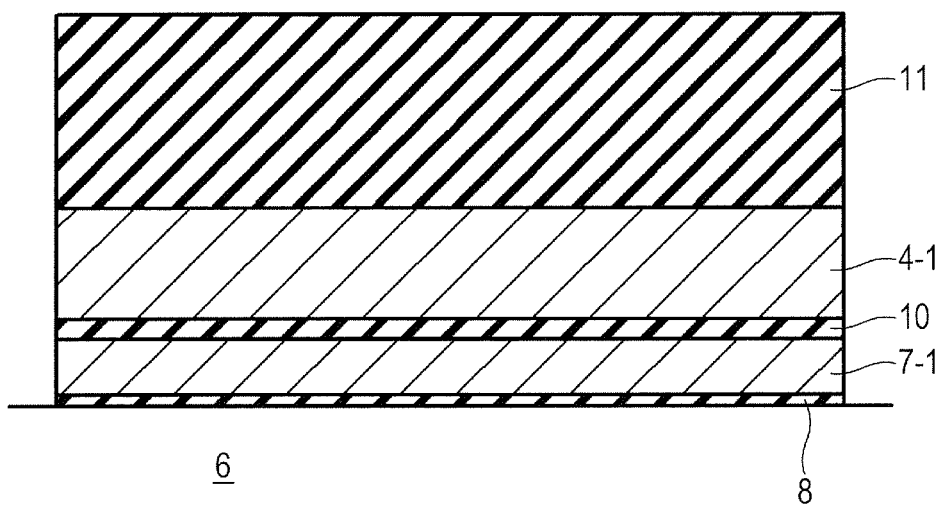
FIG. 3 is a cross sectional view illustrating the method of manufacturing a semiconductor device according to the first embodiment.

Step S1: Formation of Material Layer for Floating Gate Electrode and Material Layer for Control Gate Electrode At first, as illustrated in FIG. 3, a first insulation film 8 is formed over a semiconductor substrate 6. For example, a silicon oxide film is used as the first insulation film 8. Then, a material layer 7-1 for a floating gate electrode is formed over the first insulation film 8. The material layer 7-1 for the floating gate electrode is formed, for example, of a polysilicon film. Then, a third insulation film 10 is formed over the material layer 7-1 for the floating gate electrode. The third insulation film 10 is formed, for example, of an ONO film (silicon oxide film/silicon nitride film/silicon oxide film). Then, a material layer 4-1 for a control gate electrode is formed over the third insulation film 10. The material layer 4-1 for the control gate electrode is formed by using, for example, a polysilicon oxide film. Further, an insulation layer 11 is formed over the material layer 4-1 for the control gate electrode. The insulation layer 11 is a layer that serves as a hard mask. The insulation layer 11 is formed by using, for example, a silicon nitride film.

Step S2: Formation of Cover Layer 14

Figure 4:
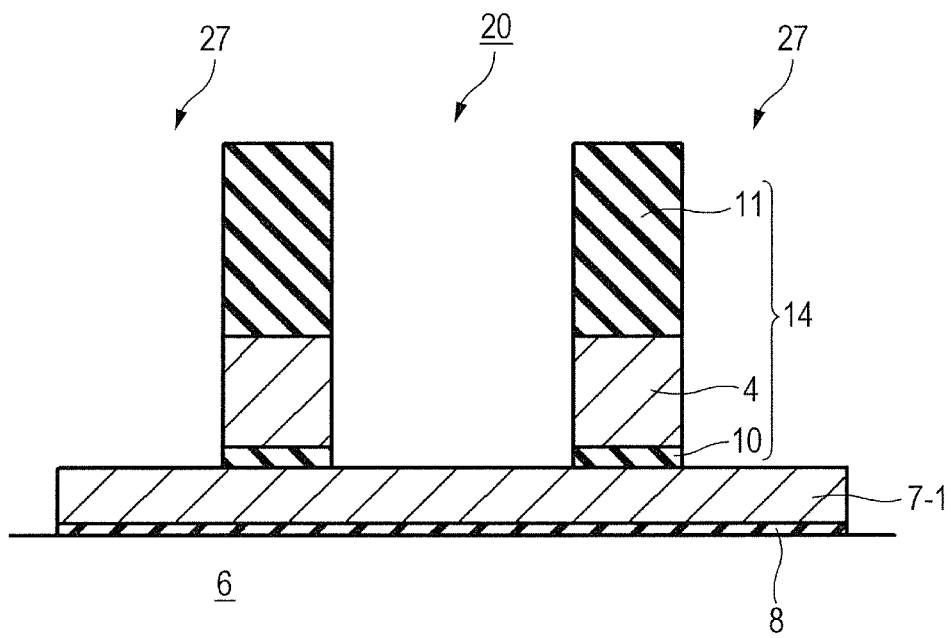
FIG. 4 is a cross sectional view illustrating the method of manufacturing the semiconductor device according to the first embodiment.

Then, as illustrated in FIG. 4, the insulation layer 11, the material layer 4-1 for the control gate electrode, and the third insulation layer 10 are fabricated so as to expose the material layer 7-1 for the floating gate electrode in a region 20 to form the erase gate electrode and in a region 27 to form the select gate electrode. Specifically a not illustrated resist film is deposited over the insulation layer 11, and the insulation layer 11, the material layer 4-1 for the control gate electrode, and the third insulation layer 10 are removed by anisotropic etching using the deposited resist film as a mask. Thus, the material layer 4-1 for the control gate electrode is fabricated to obtain a control gate electrode 4. Further, the insulation layer 11, the control gate electrode 4, and the third insulation layer 10 remain in a region where the floating gate electrode is to be formed. The remained insulation layer 11, control gate electrode 4, and the third insulation film 10 are referred to as a cover layer 14.

Step S3: Fabrication of Material Layer 7-1 for Floating Gate Electrode

Figure 5:
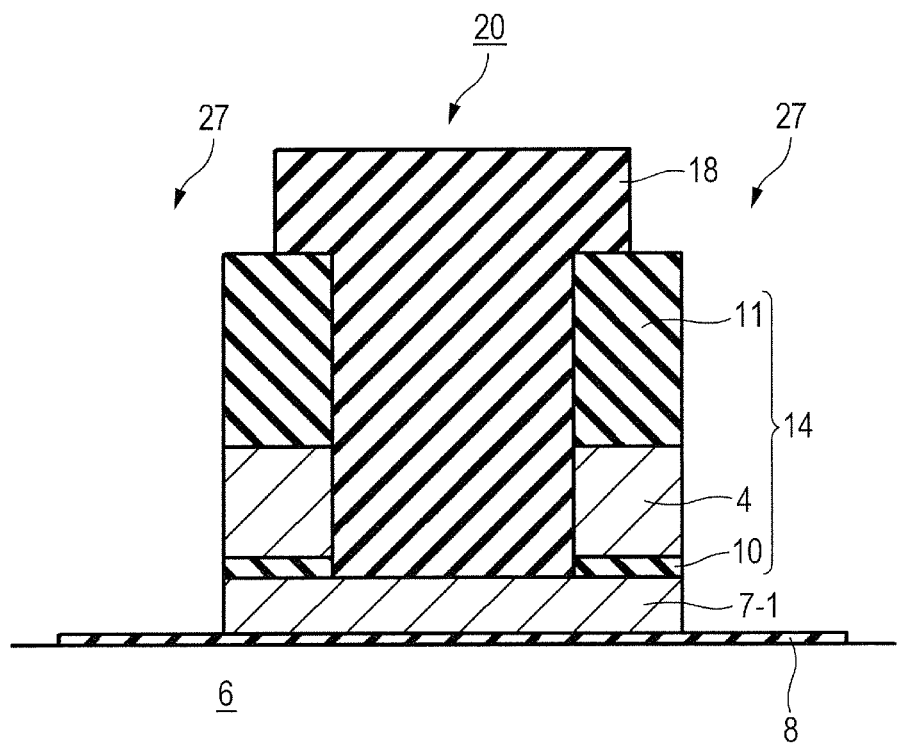
FIG. 5 is a cross sectional view illustrating the method of manufacturing the semiconductor device according to the first embodiment.

Then, as illustrated in FIG. 5, a resist 18 is deposited so as to cover a region 20 to form the erase gate electrode and not to cover a region 27 to form the select gate electrode. Further, the material layer 7-1 for the floating gate electrode is removed by anisotropic etching using the resist 18 as a mask. Thus, the first insulation film 8 is exposed in the region 27 to form a select gate electrode.

Step S4: Formation of Fourth Insulation Film 12

Figure 6:
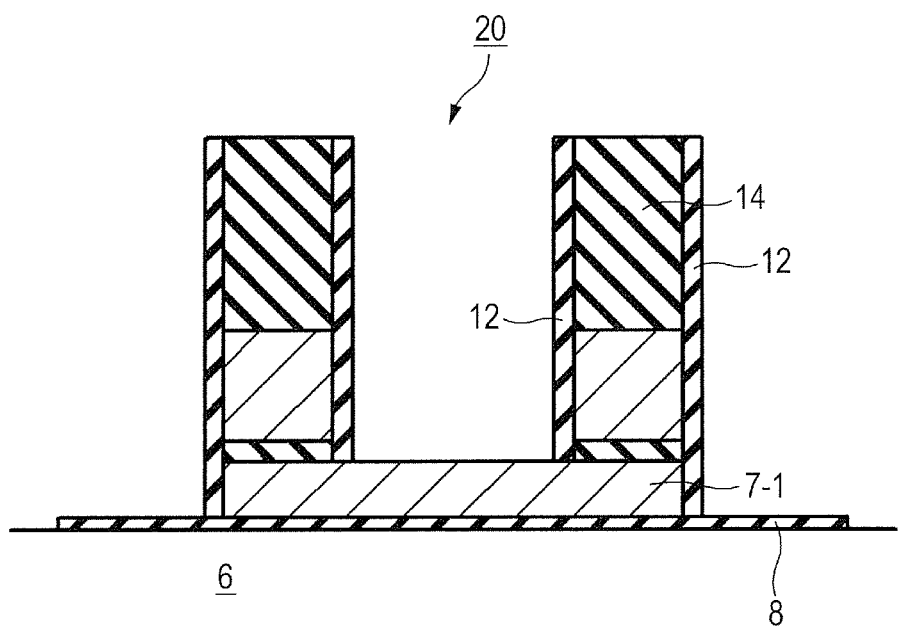
FIG. 6 is a cross sectional view illustrating the method of manufacturing the semiconductor device according to the first embodiment.

Then, as illustrated in FIG. 6, a fourth insulation film 12 is formed so as to cover the lateral side of the cover layer 14. The fourth insulation film 12 is formed by using, for example, an ON film (silicon oxide film/silicon nitride film). Specifically, the fourth insulation film 12 is deposited so as to cover the first insulation film 8, the insulation layer 11, and the material layer 7-1 for the floating gate electrode. Then, the deposited fourth insulation film 12 is removed by anisotropic etching. Thus, the fourth insulation film 12 is formed over the lateral side of the cover layer 14. The fourth insulation film 12 is formed also over the side of the material layer 7-1 for the floating gate electrode on the side of the region 27 to form the select gate electrode.

Step S5: Formation of First Side Wall Layer 19

Figure 7:
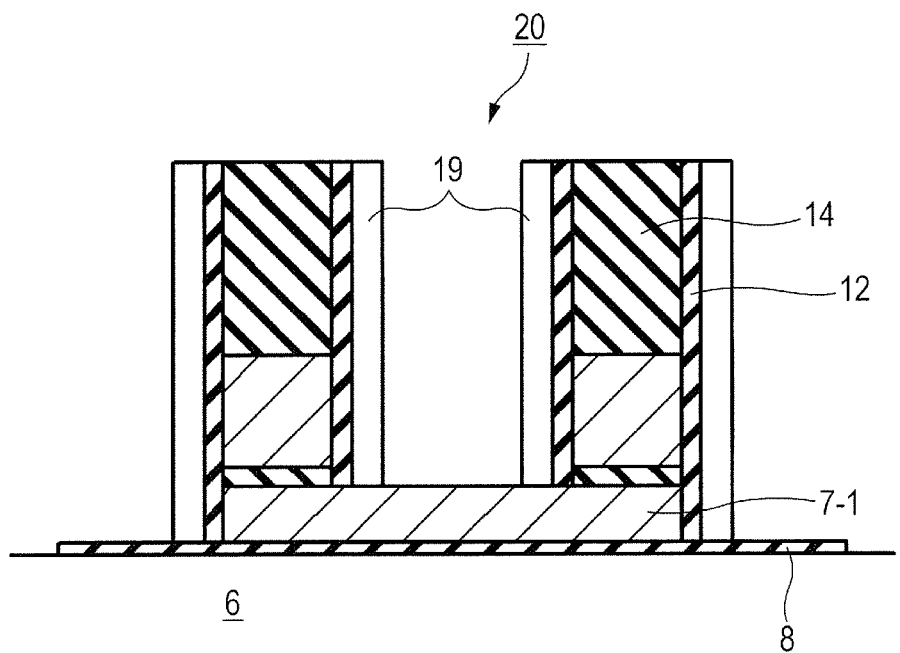
FIG. 7 is a cross sectional view illustrating the method of manufacturing the semiconductor device according to the first embodiment.

Then, as illustrated in FIG. 7, a first side wall layer 19 is formed. The first side wall layer 19 is formed by using, for example, a silicon oxide film. Specifically, an insulation film (silicon oxide film) is deposited so as to cover the entire surface of the substrate, and then removed by anisotropic etching. Thus, an insulation film is formed as the first side wall layer 19 on the lateral side of the coating layer 14 and the material layer 7-1 for the floating gate electrode.

Step S6: Etching

Figure 8:
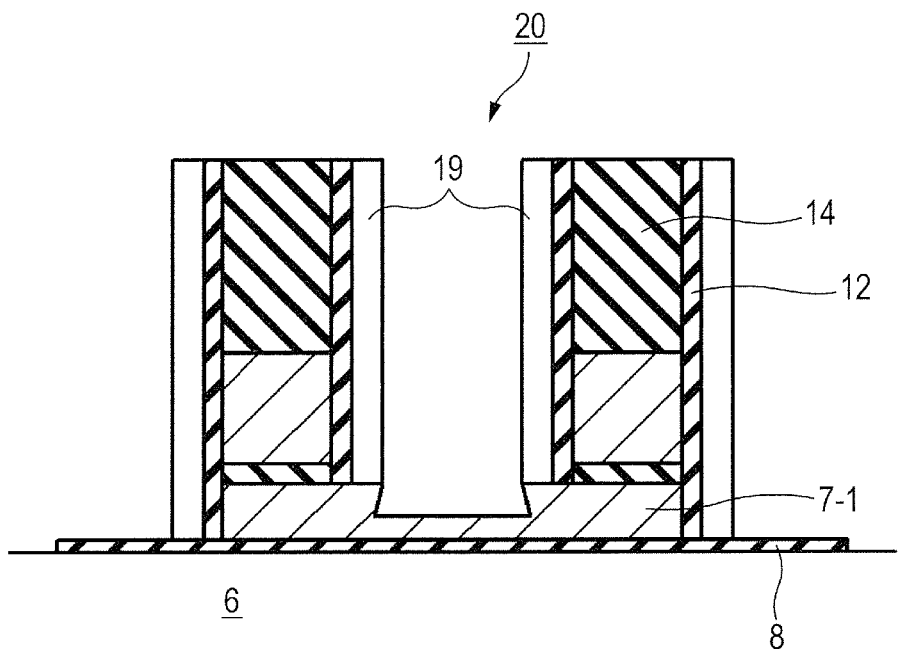
FIG. 8 is a cross sectional view illustrating the method of manufacturing the semiconductor device according to the first embodiment.

Then, as illustrated in FIG. 8, the material layer 7-1 for the floating gate electrode is removed by anisotropic etching using the first side wall layer 19 as the mask. In this step, the material layer 7-1 for the floating gate electrode is not removed completely but removed to such a depth so as not to expose the first insulation film 8. Specifically, the material layer 7-1 for the floating gate electrode is etched to a depth about one-half of the film thickness.

For the etching condition, a condition under which etching proceeds not only in the direction of the depth but also in the lateral direction is used preferably. When such a condition is used, the end of the floating gate electrode 7 can be formed to an inverted tapered shape.

Step S7: Formation of Second Side Wall Layer 21

Figure 9:
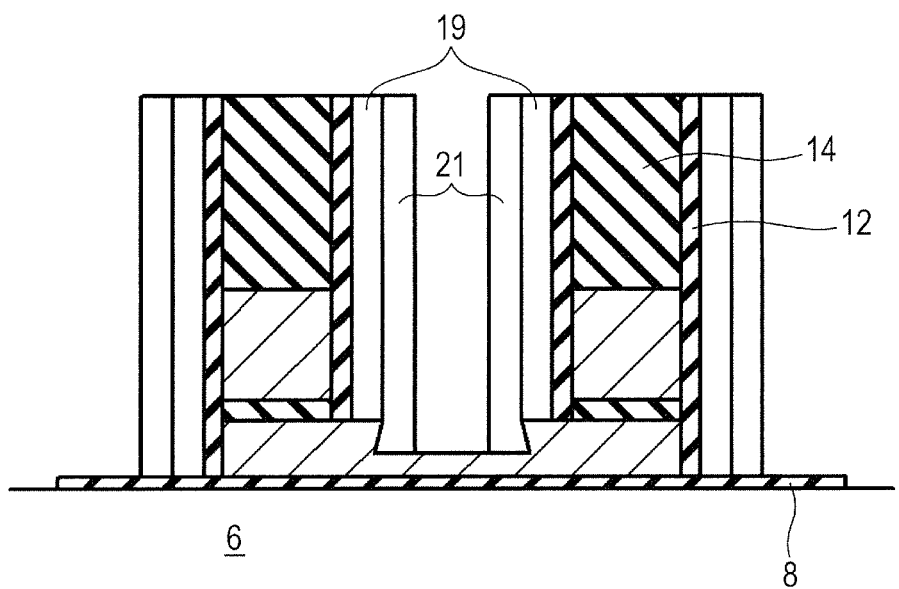
FIG. 9 is a cross sectional view illustrating the method of manufacturing the semiconductor device according to the first embodiment.

Then, as illustrated in FIG. 9, a second side wall layer 21 is formed. The second side wall layer 21 is formed by using, for example, a silicon oxide film. Specifically, the insulation film (silicon oxide film) is deposited so as to cover the entire surface of the substrate and then etched anisotropically. Thus, an insulation film is formed as the second side wall layer 21 so as to cover the first side wall layer 19.

Step S8: Etching

Figure 10:
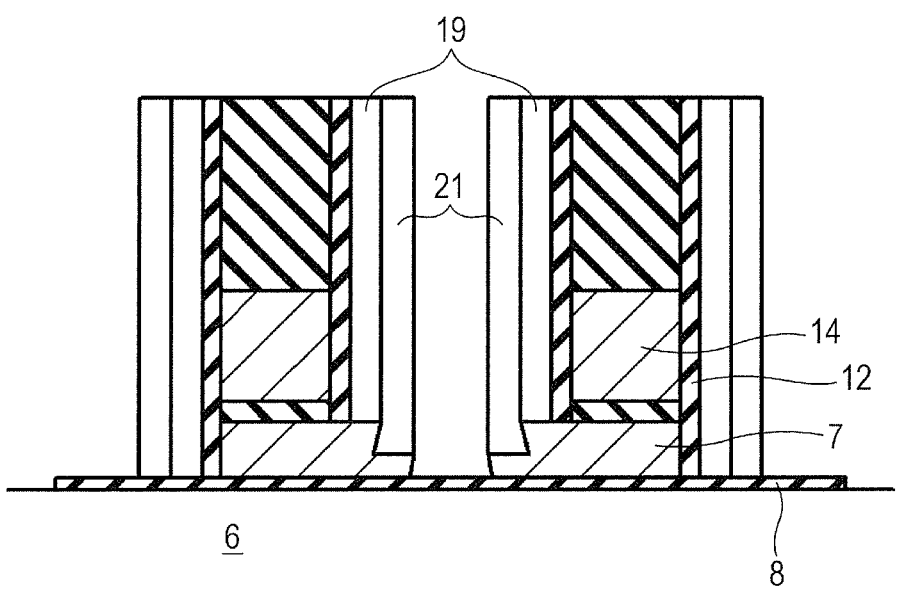
FIG. 10 is the cross sectional view illustrating the method of manufacturing a semiconductor device according to the first embodiment.

Then as illustrated in FIG. 10, the material layer 7-1 for the floating gate electrode is removed by anisotropic etching using the first side wall layer 19 and the side wall layer 21 as a mask. The floating gate electrode layer 7-1 is removed till the first insulation film 8 is exposed. Thus, the floating gate electrode 7 is obtained. For the etching condition, a condition under which etching proceeds not only in the direction of the depth but also in the lateral direction in the same manner as in the step S6 is used preferably. By using such a condition, the end of the floating gate electrode 7 can be formed to an inversely tapered shape.

Step S9: Formation of Source Region 2-1

Figure 11:
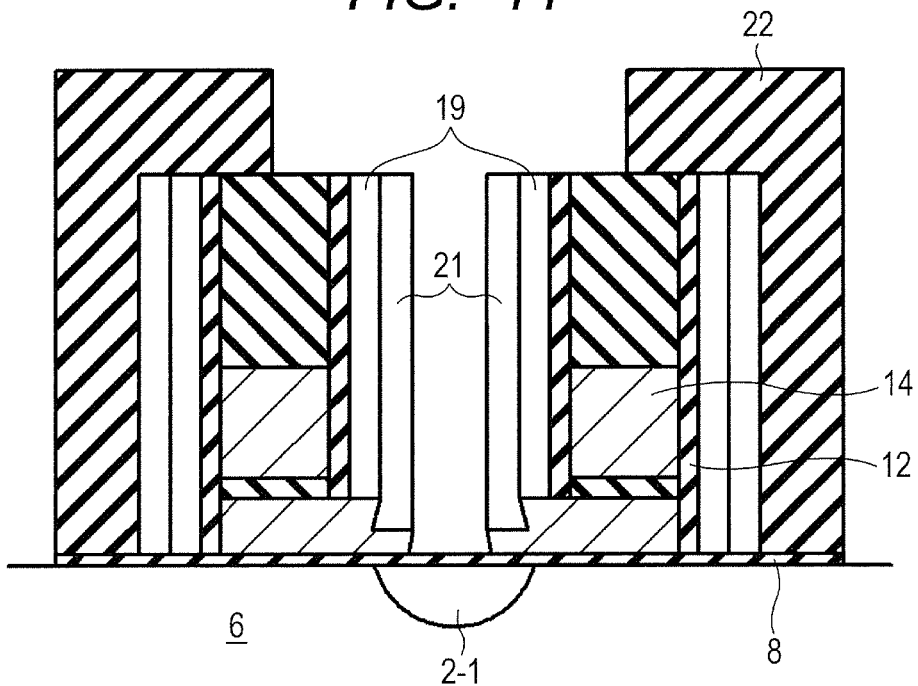
FIG. 11 is a cross sectional view illustrating the method of manufacturing the semiconductor device according to the first embodiment.

Then, as illustrated in FIG. 11, a resist 22 is deposited. Then, ions at a high voltage are implanted using the resist 22 as a mask to form a source region 2-1 in the semiconductor substrate 6.

Step S10: Removal of Side Wall Layer

Figure 12:
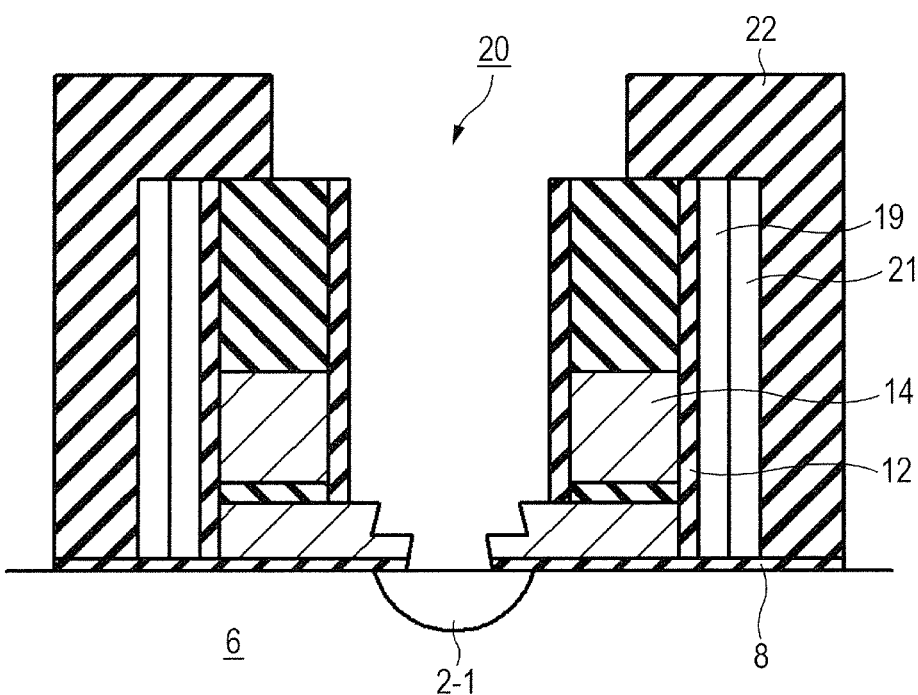
FIG. 12 is a cross sectional view illustrating the method of manufacturing the semiconductor device according to the first embodiment.

Then, as illustrated in FIG. 12, the first side wall layer 19 and the second side wall layer 21 are removed in the region 20 to form a erase gate electrode. The first side wall layer 19 and the second side wall layer 21 are removed, for example, by anisotropic etching.

Step S11: Formation of Second Insulation Film

Figure 13:
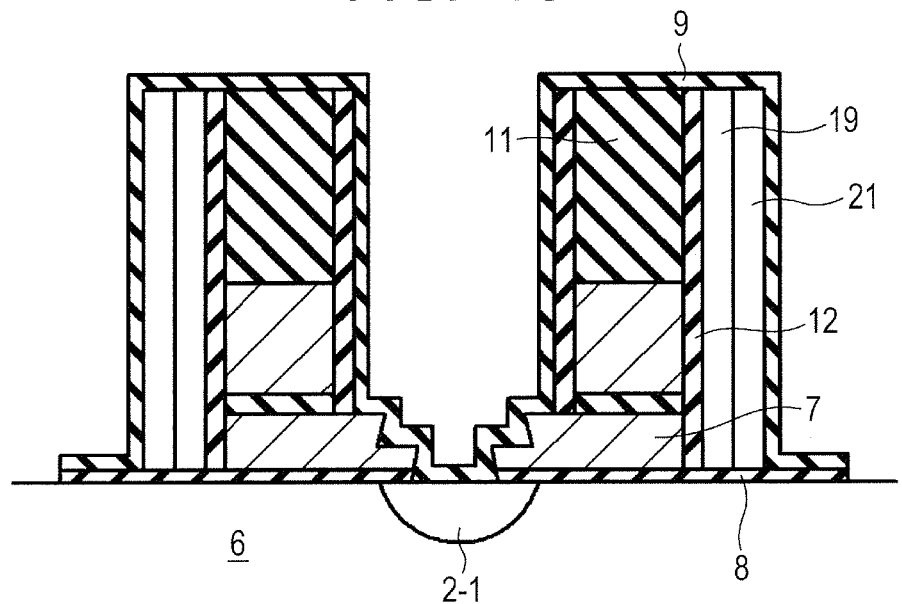
FIG. 13 is a cross sectional view illustrating the method of manufacturing the semiconductor device according to the first embodiment.

Successively, as illustrated in FIG. 13, a second insulation film 9 (for example, silicon oxide film) is deposited. The first side wall layer 19, the second side wall layer 21, the source region 2-1, the floating gate electrode 7, and the insulation layer 11 are covered by the second insulation film 9.

Step S12: Removal of Side Wall Layer

Figure 14:
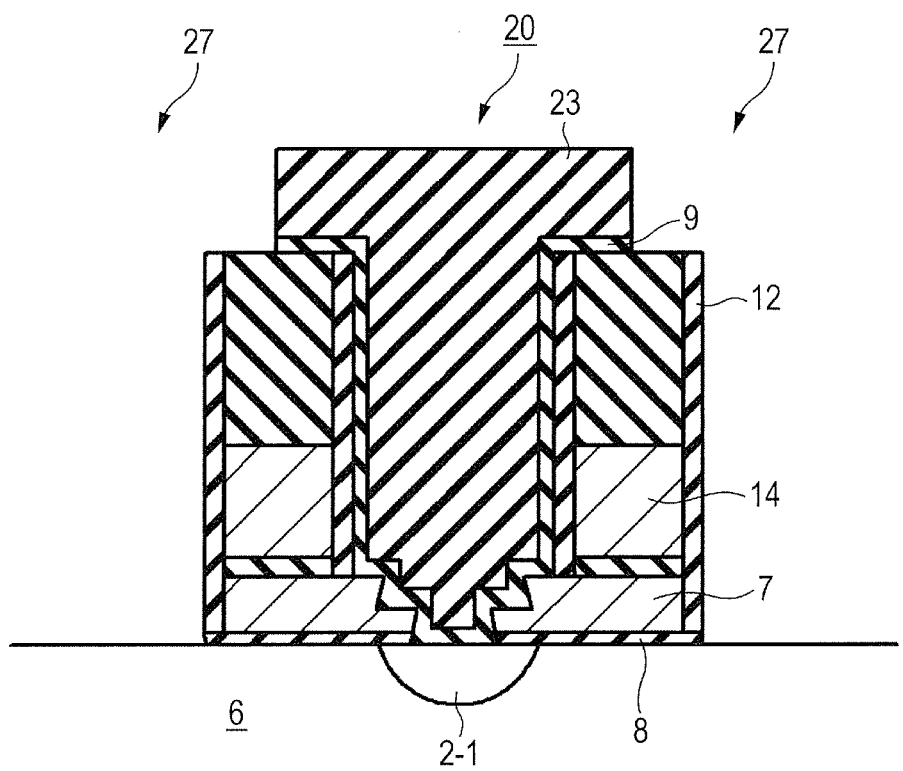
FIG. 14 is a cross sectional view illustrating the method of manufacturing the semiconductor device according to the first embodiment.

Then, as illustrated in FIG. 14, a resist 23 is formed so as to protect the region 20 to form the erase gate electrode. Etching is performed by using the resist 23 as a mask. Thus, the side wall layers (first side wall layer 19, second side wall layer 21) on the side of the region 27 to form a select gate electrode are removed. Further, in the region 27 to form the select gate electrode, the second insulation film 9 and the first insulation film 8 are removed to expose the semiconductor substrate 6.

Step S13: Formation of Select Gate Insulation Film 28

Figure 15:
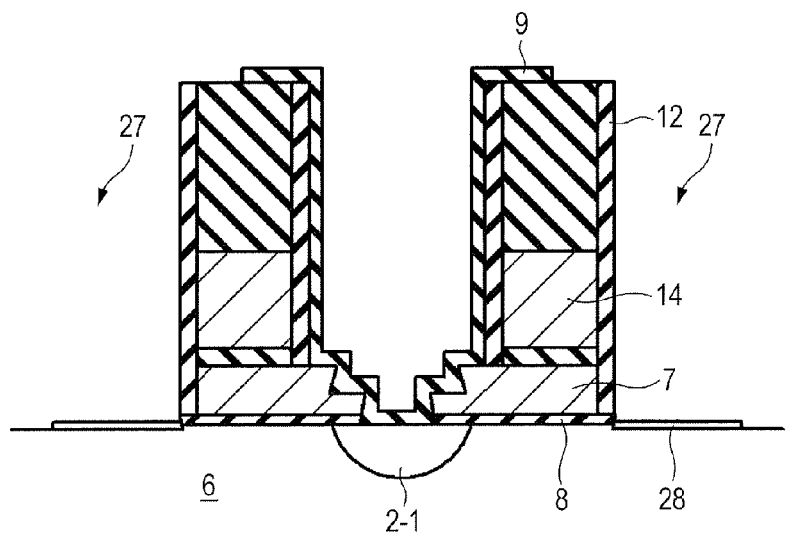
FIG. 15 is a cross sectional view illustrating the method of manufacturing the semiconductor device according to the first embodiment.

Then, as illustrated in FIG. 15, in the region 27 to form the select gate electrode, a select gate insulation film 28 (for example, silicon oxide film) is formed over the semiconductor substrate 6.

Step S14: Formation of Erase Gate Electrode 5 and Select Gate Electrode 3

Figure 16:
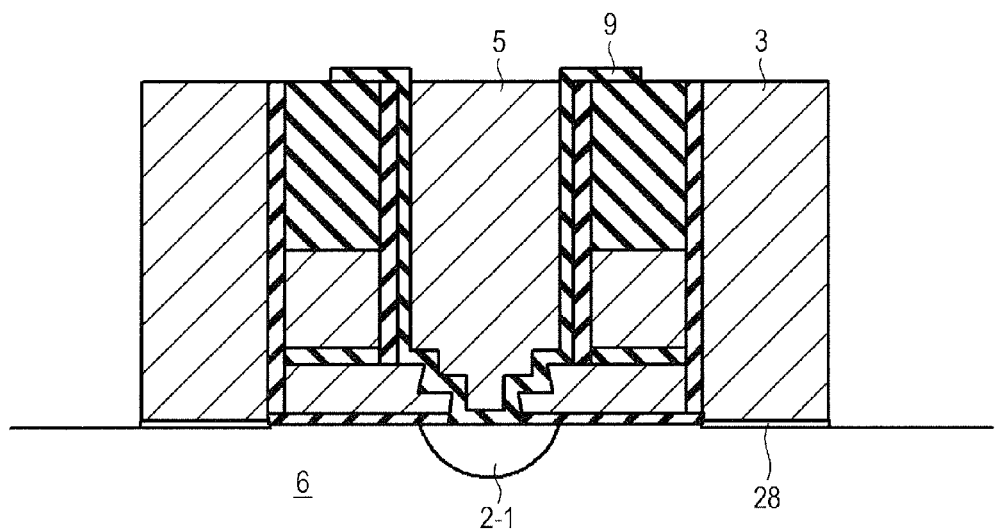
FIG. 16 is a cross sectional view illustrating the method of manufacturing the semiconductor device according to the first embodiment.

Then, as illustrated in FIG. 16, an erase gate electrode 5 and a select gate electrode 3 are formed. For example, a polysilicon film is deposited over the semiconductor substrate 6, and the deposited polysilicon film is removed by anisotropic etching. Thus, the erase gate electrode 5 and the select gate electrode 3 are formed with a remaining polysilicon film.

Step S14: Formation of Drain Region 2-2

Figure 17:
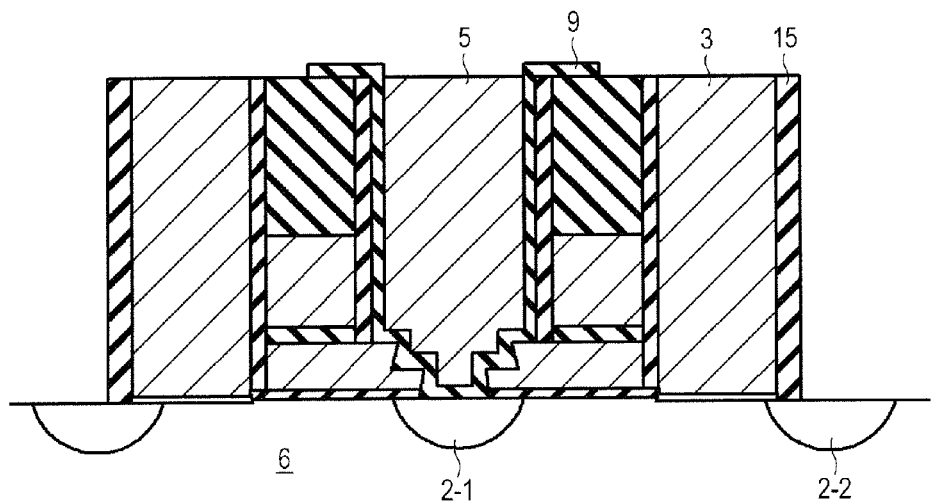
FIG. 17 is a cross sectional view illustrating the method of manufacturing the semiconductor device according to the first embodiment.

Then, as illustrated in FIG. 17, a fifth insulation film 15 is formed over the lateral side of the select gate electrode 3. The fifth insulation film 15 is formed using, for example, an ONO film (oxide film/nitride film/oxide film). The fifth insulation film 15 can be formed by depositing an insulation film over the entire surface of the semiconductor substrate 6 and, subsequently, performing anisotropic etching. Then, a drain region 2-2 is formed by ion implantation in the semiconductor substrate 6.

Step S14: Formation of Interlayer Insulation Film 13, Contact 16, and First Interconnect Layer 17

Then, an interlayer insulation film 13, a contact 16, and a first interconnect layer 17 are formed. Thus, the semiconductor device 1 illustrated in FIG. 1 is obtained.

According to the manufacturing method described above, by using the side walls (first side wall layer 19 and second side wall layer 21) of the cover layer 14 as a mask, multiple corners are formed at the end of the floating gate electrode 7. When the multiple corners are formed at the end of the floating gate electrode 7, the area of the region where the multiple corners are formed tends to be increased as viewed from above. On the contrary, the dimension of the side wall layer is easy to control. In this embodiment, since the multiple corners are formed using the side wall layer as a mask, the multiple corners can be formed in a minute region. Accordingly, an increase in the area of the semiconductor device 1 can be suppressed.

Further, according to the manufacturing method described above, the second insulation film 9 and the erase gate electrode 5 are formed after forming the multiple corners to the end of the floating gate electrode 7. Thus, the shape of the erase gate electrode 5 can be formed into a shape conforming to the shape of the end of the floating gate electrode 7. As a result, increase in the coupling capacity can be suppressed.

The manufacturing method described above is an example and other manufacturing methods may also be adopted so long as similar constitutions can be obtained. Further, the conduction type of the semiconductor layer may be a conduction type opposite to that described above.

Second Embodiment

Figure 18:
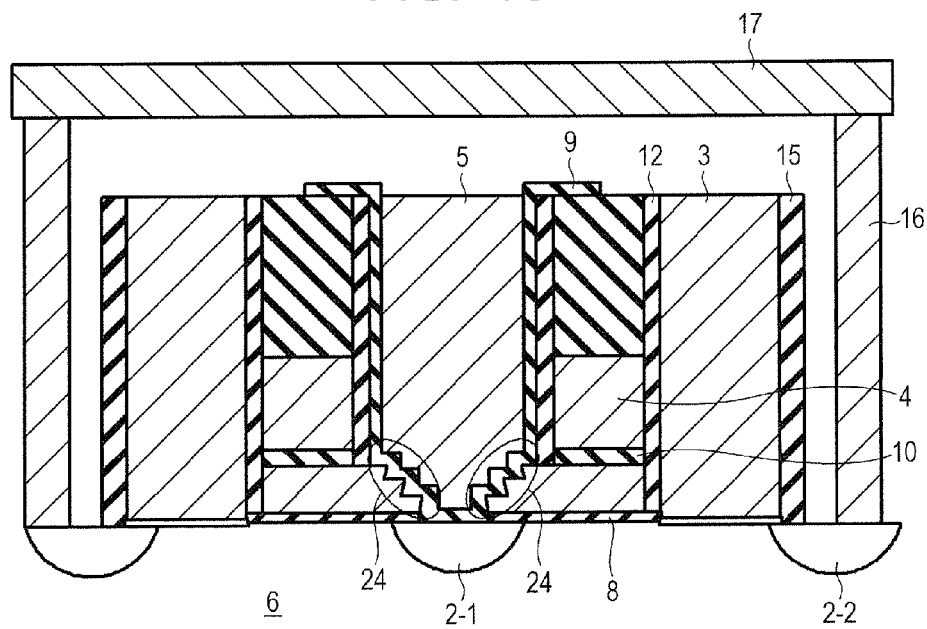
FIG. 18 is a cross sectional view illustrating a semiconductor device according to a second embodiment.

Successively, a second embodiment of the invention is to be described. FIG. 18 is a cross sectional view illustrating a semiconductor device 1 according to this embodiment. The first embodiment has been described to a case in which the corners are formed at two positions in the opposing region 24. On the other hand, in this embodiment, the corners are formed at three positions in the opposing region 24. Other configurations identical with those of the first embodiment can be used.

In this embodiment, when the end of the floating gate electrode 7 is fabricated (steps S5 to S8: refer to FIG. 7 to FIG. 10), etching is performed at three stages. That is, after forming the second side wall layer 21, the material layer 7-1 for the floating gate electrode is removed to such an extent as not exposing the first insulation film 8. Then, a third side wall layer is formed over the lateral side of the second side wall layer 21, and the material layer 7-1 for the floating gate electrode is etched by using the third side wall layer as a mask till the first insulation film 8 is exposed. Thus, three corners can be formed to the opposing region 24.

According to this embodiment, since the three corners are provided, number of the electric field concentration portions can be increased compared with the case where the two corners are present. Thus, the erase efficiency can be improved.

Four or more corners can be provided by repeating the formation and the etching treatment of the side wall layer.

Third Embodiment

Successively, a third embodiment is to be described. The embodiments described above have been explained to a case in which the control gate electrode 4 and the erase gate electrode 5 are provided separately. On the contrary, this embodiment is to be described to a case in which the control gate electrode 4 serves also as the erase gate electrode 5. For portions with no particular explanation, configurations comparable with those of the embodiments described above can be adopted.

Figure 19:
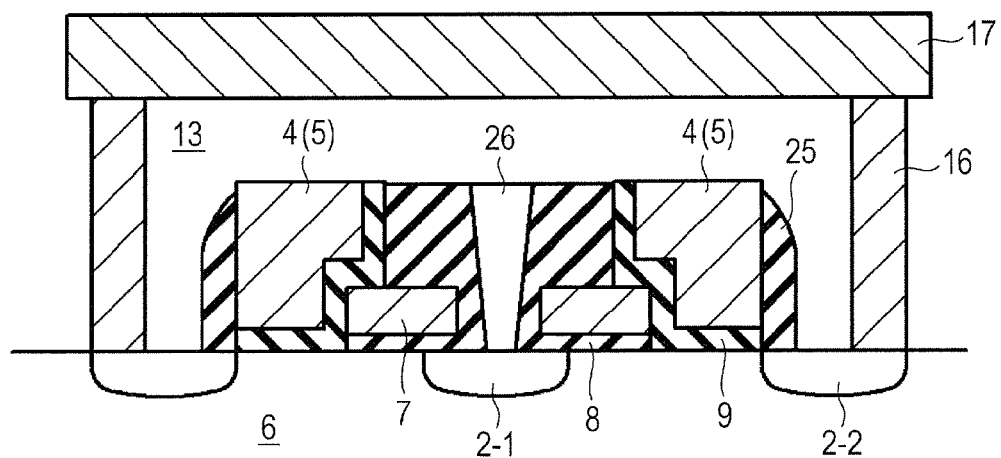
FIG. 19 is a cross sectional view illustrating a semiconductor device as a comparative example.

At first, a comparative example is to be described with reference to FIG. 19. FIG. 19 is a cross sectional view illustrating a semiconductor device 1 as a comparative example.

As illustrated in FIG. 19, a semiconductor device 1 according to the comparative example has a semiconductor substrate 6, a floating gate electrode 7, a control gate electrode 4, a source region 2-1, and a drain region 2-2.

The source region 2-1 and the drain region 2-2 are provided over the main surface of the semiconductor substrate 6. In the same manner as in the embodiments described above, the source region 2-1 and the drain region 2-2 are spaced apart.

A floating gate electrode 7 is provided via a first insulation film 8 over the semiconductor substrate 6. The floating gate electrode 7 is situated between the source region 2-1 and the drain region 2-2 as viewed from above. The floating gate electrode 7 is covered by an insulation film.

A control gate electrode 4 is provided via a second insulation film 9 over the semiconductor substrate 6. The control gate electrode 4 is situated between the floating gate electrode 7 and the drain region 2-2 as viewed from above. Further, the control gate electrode 4 covers the end of the floating gate electrode 7 via a second insulation film 9. A corner is present by one at the end of the floating gate electrode 7.

An insulation layer is formed as a side wall layer 25 over the lateral side of the control gate electrode 4. Further, a conductive source plug 26 is buried in an insulation film above the source region 2-1. The conductive source plug 26 is formed, for example, by a polysilicon layer. The source plug 26 is connected to the source region 2-1.

An interlayer insulation film 13 is formed above the semiconductor substrate 6 so as to cover the control gate electrode 4, the floating gate electrode 7, the source plug 26, etc. A first interconnect layer 17 is provided over the interlayer insulation film 13. A contact 16 is provided to the interlayer insulation film 13. The drain region 2-2 is connected via the contact 16 to an interconnect provided in the first interconnect layer 17.

In the semiconductor device 1 according to the comparative example 1 described above, the control gate electrode 4 serves also as the erase gate electrode 5. That is, an erase voltage is applied to the control gate electrode 4 upon erasure. By the application of the erase voltage, charges are drawn out from the floating gate electrode 7 via the second insulation film to the control gate electrode 4. In this case, the charges are drawn out via the corner at the end of the floating gate electrode 7. Operations upon reading and writing are identical with those of the embodiments described above.

Figure 20:
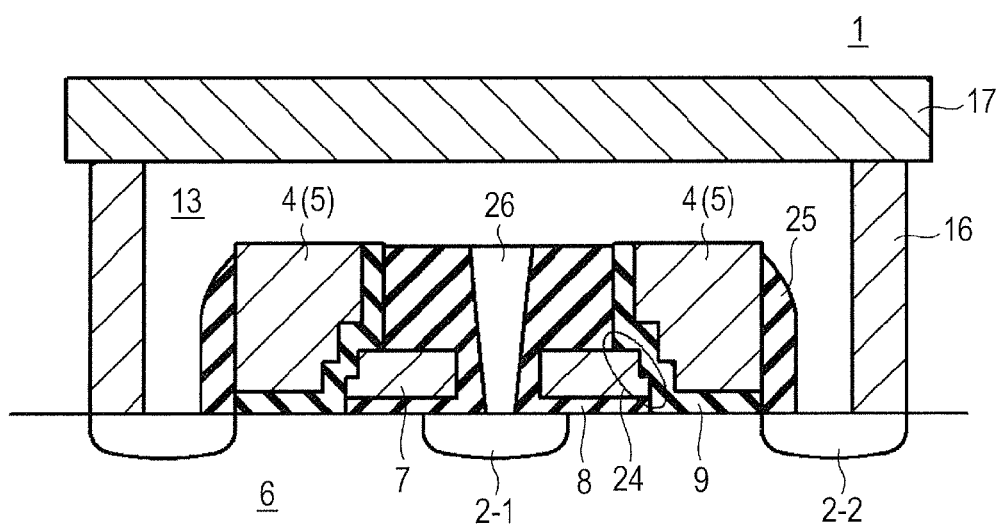
FIG. 20 is a cross sectional view schematically illustrating a semiconductor device according to a third embodiment.

Successively, a semiconductor device 1 according to this embodiment is to be described. FIG. 20 is a cross sectional view schematically illustrating the semiconductor device 1 according to this embodiment.

In this embodiment, the shape of a floating gate electrode 7 is different from comparative example 1. Specifically, multiple corners are formed at the end of the floating gate electrode 7 (opposing region 24 that opposes a control gate electrode 4). Also the shape of the control gate electrode 4 conforms to the shape at the end of the floating gate electrode 7. That is, multiple concave portions are formed to the control gate electrode 4 conforming to the multiple corners formed at the end of the floating gate electrode 7. Since other portions can be identical with those of the semiconductor device 1 according to comparative example 1, detailed explanations therefor are to be omitted.

In the semiconductor device 1 according to this embodiment, since the multiple corners are formed in the same manner as the embodiments described above, multiple electric field concentration portions are formed upon erasure. As a result, compared with the semiconductor device of comparative example 1, a portion where the charges are drawn out can be increased to improve the erase efficiency.

The multiple corners of the floating gate electrode 7 can be formed, for example, by performing a lithographic step in a multistage using a resist. With such a manufacturing method, it is more difficult to form multiple corners in a minute region than in the case of forming multiple corners by using the side wall as a mask as in the embodiments described above. Accordingly, with a view point of the area, it is preferred to form multiple corners by using the side wall as in the embodiments described above. However, multiple corners can be provided at the end of the floating gate electrode 7 (opposing region 24) to improve the erase efficiency also in this embodiment.

While the invention made by the present inventors have been described specifically with reference to the preferred embodiments, it will be apparent that the invention is not restricted to the embodiments described above but may be modified variously within a range not departing the gist of the invention.

What is claimed is:

1. A semiconductor device comprising:
   a semiconductor layer;
   a floating gate electrode provided over the semiconductor layer via a first insulation film; and
   an erase gate electrode to which an erase voltage is applied,
   wherein the floating gate electrode has an opposing region that opposes via a second insulation film to the erase gate electrode, and
   wherein the opposing region has such a shape that a plurality of electric field concentration portions are formed when the erase voltage is applied to the erase gate electrode,
   wherein a cross sectional shape of the floating gate electrode has a plurality of corners in the opposing region, and
   wherein a plurality of portions are formed to the erase gate electrode so as to conform to the plurality of corners.

2. The semiconductor device according to claim 1, wherein the cross sectional shape of the floating gate electrode in the opposing region has a stepwise shape.

3. The semiconductor device according to claim 1, further comprising:
   a source region and a drain region provided in the semiconductor layer,
   wherein the floating gate electrode is situated between the source region and the drain region as viewed from above.

4. The semiconductor device according to claim 1, further comprising:
   a control gate electrode to which a read voltage is applied upon reading.

5. The semiconductor device according to claim 1, wherein each of the plurality of corners has a pointed shape.

6. A method of manufacturing a semiconductor device comprising:
   a semiconductor layer;
   a floating gate electrode provided over the semiconductor layer via a first insulation film;
   an erase gate electrode to which an erase voltage is applied,
   the floating gate electrode having an opposing region that opposes the erase gate electrode via a second insulation film,
   the opposing region having such a shape that a plurality of electric field concentration portions are formed when the erase voltage is applied to the erase gate electrode, the method comprising:
   forming the floating gate electrode over the semiconductor layer via the first insulation film; and
   forming the erase gate electrode,
   wherein a cross sectional shape of the floating gate electrode has a plurality of corners in the opposing region, and
   wherein a plurality of portions are formed to the erase gate electrode so as to conform to the plurality of corners.

7. A method of manufacturing a semiconductor device comprising:
   a semiconductor layer;
   a floating gate electrode provided over the semiconductor layer via a first insulation film;
   an erase gate electrode to which an erase voltage is applied, the floating gate electrode having an opposing region that opposes the erase gate electrode via a second insulation film, the opposing region having such a shape that a plurality of electric field concentration portions are formed when the erase voltage is applied to the erase gate electrode, the method comprising:

forming the floating gate electrode over the semiconductor layer via the first insulation film; and forming the erase gate electrode, wherein the step of forming the floating gate electrode further includes:

forming the first insulation film over the semiconductor layer;

forming a material layer for the floating gate electrode over the first insulation film; and fabricating a material layer for the floating gate electrode so as to form the floating gate electrode, and wherein the step of fabricating the material layer for the floating gate electrode further includes:

forming a cover layer over the material layer for the floating gate electrode so as to expose the material layer for the floating gate electrode in a region to form the erase gate electrode;

forming a first side wall layer so as to cover the lateral side of the cover layer on the side of the region to form the erase gate electrode;

etching the material layer for the floating gate electrode using the cover layer and the first side wall layer as a mask to such a depth as not exposing the first insulation layer;

forming a second side wall layer so as to cover the lateral side of the first side wall layer after the etching step; and etching the material layer for the floating gate electrode using the cover layer, the first side wall layer, and the second side wall layer as a mask.

8. The method of manufacturing the semiconductor device according to claim 7, wherein the step of forming the erase gate electrode further includes:

removing the first side wall layer and the second side wall layer;

forming the second insulation film so as to cover the floating gate electrode and the cover layer in a region to form the erase gate electrode; and forming the erase gate electrode over the second insulation film.

9. The method of manufacturing the semiconductor device according to claim 7, further comprising:

forming a source region or a drain region in the semiconductor layer after the step of forming the floating gate electrode, wherein the step of forming the erase gate electrode is performed after the step of forming the source region or the drain region.

10. The method of manufacturing the semiconductor device according to claim 7, wherein the step of forming the cover layer further includes:

forming a third insulation film over the material layer for the floating gate electrode;

forming a material layer for the control gate electrode over the third insulation film layer; and fabricating the third insulation film and the material layer for the control gate electrode so as to expose the material layer for the floating gate electrode in a region to form the erase gate electrode.

11. The method of manufacturing the semiconductor device according to claim 7, wherein the step of etching the material layer for the floating gate electrode using the cover layer, the first side wall layer, and the second side wall layer as a mask includes a step of performing etching to such a depth as not exposing the first insulation layer, and wherein the step of fabricating the material layer for the floating gate electrode further includes:

forming a third side wall layer so as to cover the lateral side of the second side wall layer after the step of etching the material layer for the floating gate electrode by using the cover layer, the first side wall layer, and the second side wall layer as a mask; and etching the material layer for the floating gate electrode by using the cover layer, the first side wall layer, the second side wall layer, and the third side wall layer as a mask.

12. The semiconductor device according to claim 1, wherein a control gate is provided over the floating gate, and the control gate and the floating gate are adjacent to the erase gate in a horizontal direction.

13. The method of manufacturing the semiconductor device according to claim 6, wherein a control gate is formed over the floating gate, such that the control gate and the floating gate are adjacent to the erase gate in a horizontal direction.

14. The semiconductor device according to claim 1, wherein at least a part of the erase gate is provided on the semiconductor layer having only an insulating film provided between the erase gate and the semiconductor layer.

15. The method of manufacturing the semiconductor device according to claim 6, wherein at least a part of the erase gate is provided on the semiconductor layer having only an insulating film provided between the erase gate and the semiconductor layer.

* * * * *